(12) United States Patent
Bower

(10) Patent No.: US 7,586,115 B2
(45) Date of Patent: *Sep. 8, 2009

(54) LIGHT EMISSION FROM SEMICONDUCTOR INTEGRATED CIRCUITS

(75) Inventor: Robert W. Bower, Haiku, HI (US)

(73) Assignee: EPIR Technologies, Inc., Bolingbrook, IL (US)

(*) Notice: Subject to any disclaimer, the term of this patent is extended or adjusted under 35 U.S.C. 154(b) by 16 days.

This patent is subject to a terminal disclaimer.

(21) Appl. No.: 11/481,238

(22) Filed: Jul. 3, 2006

(65) Prior Publication Data

US 2007/0018174 A1  Jan. 25, 2007

Related U.S. Application Data

(63) Continuation-in-part of application No. 11/377,926, filed on Mar. 15, 2006, now abandoned, which is a continuation of application No. 10/033,715, filed on Dec. 28, 2001, now Pat. No. 7,061,006.

(60) Provisional application No. 60/259,060, filed on Dec. 28, 2000.

(51) Int. Cl.
*H01L 29/06* (2006.01)
(52) U.S. Cl. .......................... 257/10; 257/80
(58) Field of Classification Search .................. 257/80
See application file for complete search history.

(56) References Cited

U.S. PATENT DOCUMENTS

| 4,486,769 | A | * | 12/1984 | Simko | 257/317 |
|---|---|---|---|---|---|
| 4,772,885 | A | * | 9/1988 | Uehara et al. | 349/71 |
| 5,391,259 | A | | 2/1995 | Cathey et al. | |
| 5,717,707 | A | | 2/1998 | Beernink et al. | |
| 5,898,190 | A | * | 4/1999 | Iwata | 257/99 |
| 5,949,182 | A | * | 9/1999 | Shealy et al. | 313/345 |
| 6,346,458 | B1 | | 2/2002 | Bower | |
| 6,400,070 | B1 | | 6/2002 | Yamada et al. | |
| 6,414,444 | B2 | | 7/2002 | Fox et al. | |
| 6,566,807 | B1 | * | 5/2003 | Fujita et al. | 313/506 |
| 6,777,871 | B2 | * | 8/2004 | Duggal et al. | 313/506 |
| 6,917,155 | B1 | * | 7/2005 | Kamide et al. | 313/495 |
| 7,061,006 | B1 | * | 6/2006 | Bower | 257/10 |
| 2002/0109455 | A1 | * | 8/2002 | Mitsutake et al. | 313/495 |

OTHER PUBLICATIONS

Ellis, R.K. et al. "Electron tunneling in non-planar floating gate memory structure", IDEM, 1982, pp. 749-752.

Shealy, J.R. et al. "Direct band gap structures on nanometer-scale, micromachined silicon tips", Appl. Phys. Lett., vol. 70, No. 25, Jun. 1997, pp. 3458-3460.

Prickett, B.L. et al. "Trapping in tunnel oxides grown on textured polysilicon", 21st Annual Proc. on Riliability Physics, 1983, pp. 114-117.

(Continued)

*Primary Examiner*—Wai-Sing Louie
*Assistant Examiner*—Bilkis Jahan
(74) *Attorney, Agent, or Firm*—Momkus McCluskey, LLC; Jefferson Perkins; Steven P. Behnken

(57) ABSTRACT

Structures and methods to inject electrons into an insulator from a semiconductor layer that are then collected in a thin layer of a direct semiconductor material which in turn emits light by bandgap recombination.

36 Claims, 1 Drawing Sheet

OTHER PUBLICATIONS

Dimitry Jev, S. "Understanding Semiconductor Devices", Oxford Press, New York, ISBN 019513186X, 2000, Chapter 8, Photonic Devices, Fig. 8.10.

Neamen, D. "Semiconductor Physics and Devices—Basic Principles", second edition, ISBN 0256242143, 1997, p. 67.

* cited by examiner

LIGHT EMISSION FROM SEMICONDUCTOR INTEGRATED CIRCUITS

CROSS-REFERENCE TO RELATED APPLICATIONS

This application is a continuation-in part of application Ser. No. 11/377,926, filed on Mar. 15, 2006 now abandoned, incorporated herein by reference in its entirety, which is a continuation of application Ser. No. 10/033,715, filed on Dec. 28, 2001, now U.S. Pat. No. 7,061,006, incorporated herein by reference in its entirety, which claims priority from U.S. provisional application Ser. No. 60/259,060, filed on Dec. 28, 2000, incorporated herein by reference in its entirety.

STATEMENT REGARDING FEDERALLY SPONSORED RESEARCH OR DEVELOPMENT

Not Applicable

REFERENCE TO A COMPUTER PROGRAM APPENDIX

Not Applicable

BACKGROUND OF THE INVENTION

1. Field of the Invention

This invention pertains generally to light emitting devices, and more particularly to structures and methods to inject electrons from a semiconductor surface, through an insulator layer, and into a layer of optoelectronic material placed on the insulator layer. Additionally, it pertains to methods of transporting emitted light to remote locations.

2. Description of the Background Art

The following publications, some of which are referred to herein using their corresponding number inside a square bracket (e.g., [1]), are incorporated herein by reference herein as background information for this application:

1. Shealy, J. R.; Macdonald, N. C.; Whittingham, Y. Xu. K. L.; Emerson, D. T.; Pitts, B. L.; "Direct band gap structures on nanometer-scale, micromachined silicon tips", Appl. Physics Letters, Vol. 70, (no. 25), AIP, June 1997, p. 3458-3460.

2. Ellis, R. K., Wegener, H. A. R., and Caywood, J. M.; "Electron tunneling in non-planar floating gate memory structure", IDEM, 1982, pp. 749-752.

3. Prickett, B. L., Caywood, J. M., Ellis, R. K.; "Trapping in tunnel oxides grown on textured polysilicon", $21^{st}$ annual Proceedings on Reliability Physics, 1983, pp. 114-117.

4. Wegener, H. A. R., Guterman, D. C.; "The prediction of textured poly floating gate memory endurance", $23^{rd}$ annual Proceedings on Reliability Physics, 1985, pp. 11-17.

5. Sun, Y., Giebink, N. C., Kanno, H., Ma, B., Thompson, M. E., Forrest, S. R.; "Management of singlet and triplet excitons for efficient white organic light-emitting devices", Nature, Vol. 440, pp. 918-912, Apr. 13, 2006.

While silicon has been a wonderful material for integrated electronic as well as micromechanical structures, silicon is not a material suitable for light emission. Light emission to and from integrated structures is increasingly important as device integration becomes denser and more complex. Typically, light emitting structures are formed in materials known as Light Emitting Materials (LEM) that include direct semiconductors that are found in compound II-V and II-VI, as well as ternary and quaternary materials known in the art and a variety of luminescent materials and organic light emitting materials (OLED). It should be appreciated that certain of these LEMs including the direct semiconductors may be selectively doped and otherwise altered in composition so as to enhance the probability of radiative recombination in certain areas of the LEM as is known in the art. Light emitted from LEMs may be transported from the point of emission to other locations by optical wave guiding structures derived from the "Integrated Circuit back end" metal and insulating layers found in integrated circuit structures. The emitted light can also be directed into portions of the lid or other portions of the package where the light is again guided to desired locations on the emitting or other chips or structures as desired.

Single crystal direct semiconductor integrated circuits have proven to be more difficult and expensive to form into integrated structures, so silicon integrated circuits are the technology of choice. Attempts to integrate light emission with the silicon technology have not met with a great deal of success. While silicon emission has been reported in porous silicon and it is suggested that quantum dots of silicon may be able to emit light, neither of these possibilities appears to be a practical solution at this time. It has also been reported that selectively deposited polycrystalline direct compound semiconductors placed on silicon tip arrays formed in single crystal silicon result in light emission [1]. The light emission is caused by the emission of electrons from the from the high electric field areas of the tips into the deposited direct materials which subsequently emit the light by direct recombination. This technique, however, requires difficult and expensive tips to be formed and does not combine well with the silicon integrated circuit technology.

BRIEF SUMMARY OF THE INVENTION

The present invention comprises a structure and method of generating light emission in an integrated circuit by injecting electrons from a semiconductor or metal surface, or other electron emitting surface (EES), through an insulating layer that are collected in a direct bandgap film or other LEM that converts the collected electrons into light. Certain of these LEMs including the direct semiconductors may be selectively doped and otherwise altered in composition so as to enhance the probability of radiative recombination in certain areas of the LEM as is known in the art. In general terms, the present invention utilizes oxidized polysilicon layers in a silicon integrated circuit to form light emitting structures.

The light emitted by the light emitting materials will then be guided to desired locations by using "back end" metal and insulating materials found in the integrated circuit structure or by methods known in the art to guide, collect, and organize the light into coherent packets. The light produced by the LEMs will generally be physically small with respect to the wavelength of the light emitted, so this emitted light will appear as a point source. Therefore, the back end metals and insulators must be formed in such a manner as to guide, collect, and organize the light. The light may also be directed onto peripheral structures, such as the package lid, or other structures which will contain light guiding and structuring features to direct and control the light emitted in desired ways as is known in the photonics art.

By way of example, and not of limitation, in a preferred embodiment GaInP is deposited on an oxidized polysilicon layer. Note that is not required that the layer of GaINP layer be single crystal. A potential of several volts is then applied between the polysilicon layer and the GaInP to ensure that electrons are emitted from the polysilicon and arrive and are injected into the GaInP with enough energy to allow bandgap radiation to be emitted from the GaInP layer.

In accordance with another aspect of the invention, light emission is accomplished by injecting electrons from a semiconductor or metal surface through an insulating layer that are collected in a direct bandgap film that converts the collected electrons into bandgap radiation. In accordance with a still further aspect of the invention, a light emitting integrated circuit is provided that comprises a semiconductor or metal surface, a direct bandgap film, and an intermediate insulating layer, wherein electrons injected from the semiconductor or metal surface through the insulating layer are collected in the direct bandgap film and converted into bandgap radiation.

Further objects and advantages of the invention will be brought out in the following portions of the specification, wherein the detailed description is for the purpose of fully disclosing preferred embodiments of the invention without placing limitations thereon.

BRIEF DESCRIPTION OF THE DRAWINGS

The invention will be more fully understood by reference to the following drawings which are for illustrative purposes only.

DETAILED DESCRIPTION OF THE INVENTION

Figure 1:
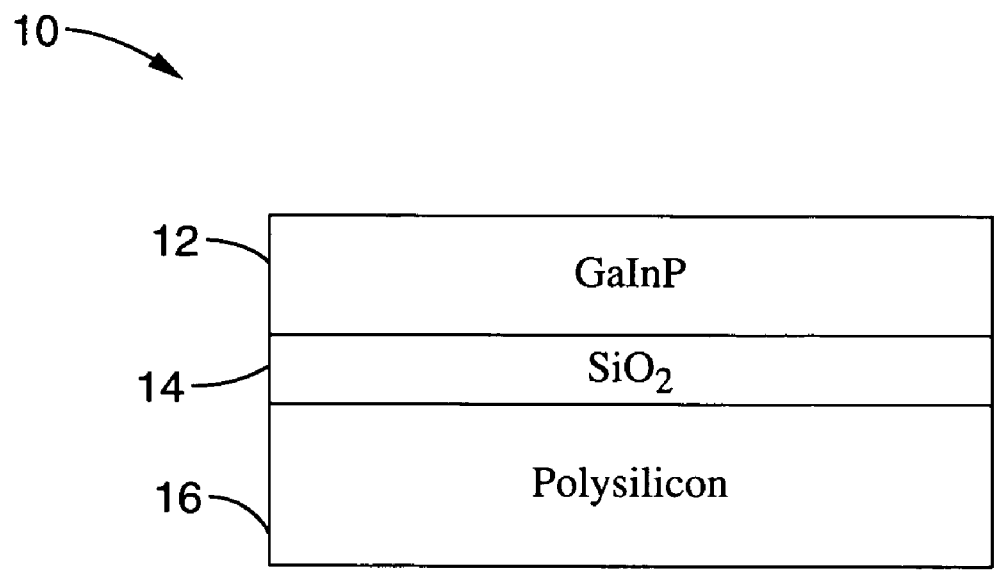
FIG. 1 is schematic diagram in cross-section of a light emitting device according to the present invention.

Referring to FIG. 1, in a preferred embodiment of a light emitting device or integrated circuit 10 according to the present invention, a light emitting film 12 comprising a direct bandgap semiconductor material or other LEM such as GaInP is deposited on an insulating layer or film (IL) 14, such as $SiO_2$, $Si_3N_4$, $Al_2O_3$, Hf oxide, other rare high k oxides, or other film as known in the art for forming thin insulating films in the integrated circuit art. This thin insulating film (IL) covers an electron emitting layer (EES). Many forms of electron emitting layers or films (EES) 16 are known in the art. Polysilicon properly oxidized to produce asperities are a preferred embodiment of an electron emitting surface (EES) capable of producing energetic electrons that produce light when they strike an LEM. Other forms of suitable EES films would comprise smooth metal or semiconductor surfaces when combined with extremely thin insulating layers or metal or semiconductor surfaces with sharp edges that may be formed by appropriate etchants as are well known in the semiconductor art. Edges of metal or semiconductor layers or junctions often create enhanced electric fields compared with a flat surface that also may be used as suitable EES structures. Furthermore, EES structures are formed at junction regions or edges of p-n junction diodes that are known to produce energetic electrons especially when biased into avalanche, Zener or other breakdown modes as are known in the semiconductor art.

The GaInP or other LEM may be deposited by evaporation, sputter deposition, or organometallic vapor phase epitaxy, for example, as is known in the art. The GaInP will not then be single crystal when deposited on the $SiO_2$ surface, but such material is suitable to convert electrons emitted from the polysilicon and injected into the GaInP into direct bandgap radiation [1]. The radiation from the GaInP creates light emission from the silicon that may be used for optical communication within the integrated circuit chip or off the chip, between chips in a three dimensional configuration (such as described in my copending U.S. application Ser. No. 09/476, 456 filed on Dec. 30, 1999, incorporated herein by reference, or Ser. No. 09/451,514 filed on Nov. 30, 1999, incorporated herein by reference), or in other configurations.

The $SiO_2$ layer is preferably on the order of one to tens of nanometers in thickness. Furthermore, the oxidized polysilicon layer is preferably formed in a manner that promotes the formation of asperities on the surface of the polysilicon that promote field emission of electrons into the $SiO_2$ layer overlying the polysilicon layer.

Properties of oxidized polysilicon formed in a manner that promotes asperities and characteristics of field emission of electrons are well known in the art [2-4]. Methods of oxidizing polysilicon are also well known in the art. It is further well known in the art that steam oxidation of polysilicon leads to enhanced asperities. Furthermore, partial removal of a steam oxide grown on polysilicon followed by reoxidation in steam is also known to enhance asperity formation. Such methods are well known in the semiconductor industry and have been used in non-volatile memory technologies.

To cause light emission to take place, a potential of approximately five to approximately twenty volts is applied between the GaInP layer 12 and the polysilicon layer 16. The voltage chosen varies based on the oxidation condition of the polysilicon, the thickness of the final $SiO_2$ layer over the polysilicon, and the bandgap of the GaInP material. A potential is applied to the LEM with respect to the electron emission layer (EEL) with a contact as described in [1] so as to attract electrons or repel energetic electrons from the EEL to the GaInP or other LEM layer as required to produce light from the LEM material. This contact to the LEM must complete the circuit by providing holes for the electrons to recombine in the basic photon creation process. The contacts for the LEMs are generally quite different from the contacts used in the silicon art, and thus must be chosen to provide the required holes and provide contact to the silicon portion of the integrated circuit. The contacts to direct bandgap materials are often alloys of Ge—Au—Ni, for example, and are well known in the art. Organic light emitting contacts are found not to be ohmic in nature and rather space charge limited. Such contacts are well known by those in the art at this time and while non-ohmic and space charge limited, they are relatively simple materials such as common metals and substances such as ITO and ZnO, which also serve similar purposes for the direct semiconductors. These contacts control electron emission from the EEL with sufficient energy to produce desired light from the GaInP or other LEM.

It will be appreciated that the structure and method of the invention is not limited to the preferred embodiment thus described. The light emitting material 12 may be any of the light emitting materials (LEM) that may be stimulated by suitable electrons to produce light. The barrier 14 separating the electron emitting layer or material (EEL) from the light emitting material (LEM) may be any insulator (IL) or junction barrier structure. The electron emitting material (EEL) 16 may be any electron emitting material or structure as previously described. For example, the light emitting material (LEM) 12 can be a direct semiconductor, such as InP, GaInP, CdInN or CdTe. These materials may be single crystal, polycrystalline, or amorphous materials. The organic light emitters may be any of the forms known in the art, including structures that have regions that are selectively doped or otherwise altered in composition in order to increase the probability of radiative recombination to produce light.

Figure 2:
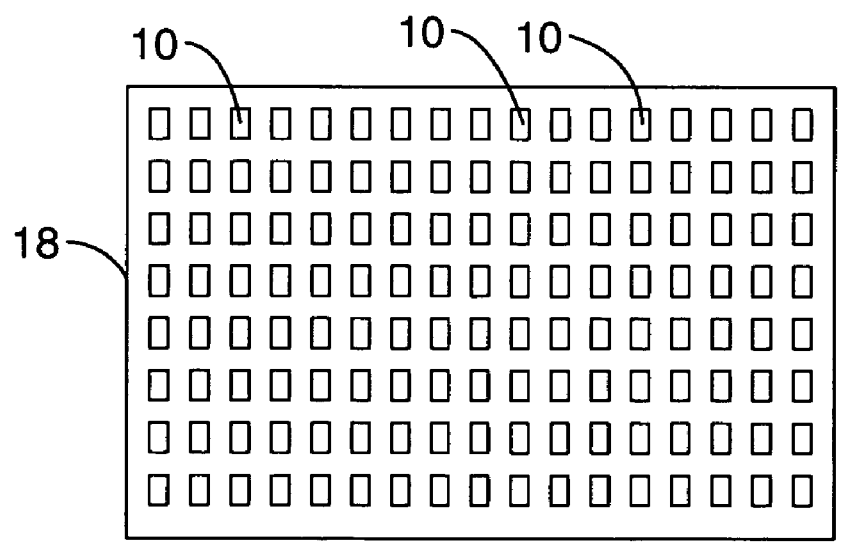
FIG. 2 is a schematic plan view of a light emitting panel according to the invention using a plurality of light emitting devices of FIG. 1 arranged in a mosaic array.

Referring now to FIG. 2, it will be appreciated that the present invention can be used for forming one-dimensional or two-dimensional light emitting panels. In FIG. 2, a plurality of optoelectronic structures 10 are arranged in a mosaic array to form a light emitting panel 18. In one configuration, elements of the array of optoelectronic structures would generally be connected to provide a common potential to the entire array, while the individual polysilicon or other electron emitting structures of layers (EEL) could be individually addressed with a potential applied to cause or modulate electron emission and thus light. In another configuration, individual optoelectronic elements or a group thereof could be individually addressed so as to cause or modulate emissions. In yet another configuration, combinations of optoelectronic elements, as well as sets of polysilicon emitters or other electron emitting structures or layers (EEL), could be addressed to provide potentials to cause or modulate light emissions.

Although the description above contains many specificities, these should not be construed as limiting the scope of the invention but as merely providing illustrations of some of the presently preferred embodiments of this invention. Therefore, it will be appreciated that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more." All structural, chemical, and functional equivalents to the elements of the above-described preferred embodiment that are known to those of ordinary skill in the art are expressly incorporated herein by reference and are intended to be encompassed by the present claims. Moreover, it is not necessary for a device or method to address each and every problem sought to be solved by the present invention, for it to be encompassed by the present claims. Furthermore, no element, component, or method step in the present disclosure is intended to be dedicated to the public regardless of whether the element, component, or method step is explicitly recited in the claims. No claim element herein is to be construed under the provisions of 35 U.S.C. 112, sixth paragraph, unless the element is expressly recited using the phrase "means for."

What is claimed is:

1. A multilayer light emitting device, comprising:
   an electron emitting layer, where said electron emitting layer is an approximately planar layer;
   an insulating layer over the electron emitting layer; and
   a light emitting layer over the insulating layer; wherein electrons emitted from the electron emitting layer pass through the insulating layer and into the light emitting layer and are converted into bandgap radiation by the light emitting layer, and wherein said electron emitting layer is formed with asperities that promote field emission of electrons into the insulating layer.

2. The light emitting device as recited in claim 1, wherein said light emitting layer comprises GaInP.

3. The light emitting device as recited in claim 1, wherein said light emitting layer comprises GaAs.

4. The light emitting device as recited in claim 1, wherein said light emitting layer comprises ZnSe.

5. The light emitting device as recited in claim 1, wherein said light emitting layer comprises ZnS.

6. The light emitting device as recited in claim 1, wherein said light emitting layer comprises GaN.

7. The light emitting device as recited in claim 1, wherein said light emitting layer comprises AlGaS.

8. The light emitting device as recited in claim 1, wherein said light emitting layer comprises SiC.

9. The light emitting device as recited in claim 1, wherein said light emitting layer comprises GaAlP.

10. The light emitting device as recited in claim 1, wherein said light emitting layer comprises InGaAlP.

11. The light emitting device as recited in claim 1, wherein said light emitting layer comprises GaP.

12. The light emitting device as recited in claim 1, wherein said light emitting layer comprises an organic light emitting material.

13. The light emitting device as recited in claim 1, wherein said light emitting layer comprises a composite film of a plurality of light emitting materials.

14. The light emitting device as recited in claim 13, wherein said light emitting materials are selected from the group consisting of: organic light emitting materials, GaInP, GaAs, ZnSe, ZnS, GaN, AlGaAs, SiC, GaAlP, InGaAlP, and GaP.

15. The light emitting device as recited in claim 1, wherein said light emitting layer comprises a mosaic film of arrays of regions of a plurality of light emitting materials.

16. The light emitting device as recited in claim 15, wherein said light emitting materials are selected from the group consisting of: organic light emitting materials, GaInP, GaAs, ZnSe, ZnS, GaN, AlGaAs, SiC, GaAlP, InGaAlP, and GaP.

17. The light emitting device as recited in claim 1, wherein said light emitting layer comprises a layered film comprising a plurality of light emitting materials.

18. The light emitting device as recited in claim 17, wherein said light emitting materials are selected from the group consisting of: organic light emitting materials, GaInP, GaAs, ZnSe, ZnS, GaN, AlGaAs, SiC, GaAlP, InGaAlP, and GaP.

19. The light emitting device of claim 1, wherein said electron emitting layer is a polysilicon electron emitting layer.

20. The light emitting device of claim 1, wherein said an insulating layer is an amorphous insulating layer.

21. The light emitting device of claim 1, wherein said light emitting layer is a direct bandgap light emitting layer.

22. The light emitting device of claim 12, wherein said organic light emitting material is selectively doped.

23. The light emitting device of claim 1, further comprising a waveguide to direct light emitted by said light emitting layer.

24. The light emitting device of claim 1, where said insulating layer is selected from the group consisting of $SiO_2$, $Si_3N_4$, $Al_2O_3$, Hf oxide, and high k oxides.

25. The light emitting device of claim 1, where said electron emitting layer includes a p-n junction diode.

26. A multilayer light emitting device, comprising:
   an electron emitting layer, where said electron emitting layer is a polysilicon layer;
   an insulating layer over the electron emitting layer; and
   a light emitting layer over the insulating layer;
   wherein electrons emitted from the electron emitting layer pass through the insulating layer and into the light emitting layer and are converted into bandgap radiation by the light emitting layer, and wherein said electron emitting layer is formed with asperities that promote field emission of electrons into the insulating layer.

27. The light emitting device as recited in claim 26, wherein said light emitting layer comprises a composite film of a plurality of light emitting materials.

28. The light emitting device as recited in claim 26, wherein said light emitting layer comprises a mosaic film of arrays of regions of a plurality of light emitting materials.

29. The light emitting device as recited in claim 26, wherein said light emitting layer comprises a layered film comprising a plurality of light emitting materials.

30. The light emitting device as recited in claim 26, wherein said light emitting materials are selected from the group consisting of: organic light emitting materials, GaInP, GaAs, ZnSe, ZnS, GaN, AlGaAs, SiC, GaAlP, InGaAlP, and GaP.

31. The light emitting device of claim 26, wherein said an insulating layer is an amorphous insulating layer.

32. The light emitting device of claim 26, wherein said light emitting layer is a direct bandgap light emitting layer.

33. The light emitting device of claim 30, wherein said organic light emitting material is selectively doped.

34. The light emitting device of claim 26, further comprising a waveguide to direct light emitted by said light emitting layer.

35. The light emitting device of claim 26, where said insulating layer is selected from the group consisting of $SiO_2$, $Si_3N_4$, $Al_2O_3$, Hf oxide, and high k oxides.

36. The light emitting device of claim26, where said electron emitting layer includes a p-n junction diode.

* * * * *